United States Patent [19]

Basi

[11] 4,057,939
[45] Nov. 15, 1977

[54] SILICON WAFER POLISHING

[75] Inventor: Jagtar S. Basi, Fishkill, N.Y.

[73] Assignee: International Business Machines Corporation, Armonk, N.Y.

[21] Appl. No.: 638,018

[22] Filed: Dec. 5, 1975

[51] Int. Cl.² .............................................. B24B 1/00
[52] U.S. Cl. ................................... 51/281 R; 51/307; 51/308; 106/3
[58] Field of Search ................ 51/307, 308, 309, 281, 51/283; 106/3

[56] References Cited

U.S. PATENT DOCUMENTS

| 3,328,141 | 6/1967 | Lachapelle | 51/308 |
| 3,552,071 | 1/1971 | Albanese | 51/307 |
| 3,715,842 | 2/1973 | Tredinnick et al. | 51/308 |
| 3,807,979 | 4/1974 | Cromwell | 51/308 |
| 3,874,129 | 1/1975 | Deckert | 51/308 |
| 3,922,393 | 11/1975 | Serrs | 51/308 |

OTHER PUBLICATIONS

IBM Technical Disclosure Bulletin, vol. 15, No. 6, Nov. 1972, pp. 1760–1761, Planetary "Free" Wafer Polisher by F. E. Goetz et al.
IBM Technical Report Tr. 22.322, Dec. 21, 1966, Polishing of Silicon by E. Mendel, pp. 1–28.

Primary Examiner—Donald J. Arnold
Attorney, Agent, or Firm—Henry Powers

[57] ABSTRACT

The polishing of monocrystalline silicon wafers with an aqueous composition of fine sized abrasive particles, a soluble alkali metal base such a sodium carbonate and an oxidizing agent such as sodium or potassium salt of dichloroisocyanuric acid (e.g., salts of halo-trizenetrione).

16 Claims, 2 Drawing Figures

SILICON WAFER POLISHING

FIELD OF THE INVENTION

This invention relates to the polishing of semiconductor planar substrates and more particularly to polishing compositions for silicon semiconductor substrates at improved polishing rates and high degree of perfection.

DESCRIPTION OF THE PRIOR ART

Semiconductor devices such as integrated monolithic circuits, diodes, passive devices, and the like, are formed by various additive techniques, such as diffusion and epitaxial growth, in the planar surfaces of semiconductor substrates. For such semiconductor device fabrication, polished silicon wafers, free of undesirable crystal defects and surface imperfections is a basic requirement. Polishing and cleaning of the wafers is normally the last process in preparation of the wafers for device fabrication.

Although the requirement for high degree of polishing has heretofore existed in the semi-conductor art, the higher levels of microminiaturization of device size, the perfection of surface quality of the polished wafer has become of peramount importance in regard to featureless of surface fine-structure conditions down to an order of Angstrom units, planarity, uniformity and freedom of surface irregularities and crystal damage.

A review of the literature and other information indicates that a substantial portion of commercially available silicon wafers are polished with compositions comprised of silicon dioxide having particle sizes in the colloidal range of 1–500 m$\mu$ (millimicrons) with particles suitable for polishing ranging in size from 10–150 m$\mu$. Properly sized silicon dioxide compositions with nominal particle sizes of 16 m$\mu$ are commercially available normally, for convenience, in the form of sols and gels, such as the material marketed under the trademark "Syton" by the Monsanto Company, "Ludox" (a silica sol) by DuPont and "Quso" (a microcrystalline silica) by Philadelphia Quartz Co. The above composition, Syton, will have a weight percent dispersion, in water, of silicon dioxide which may vary between 10 to 50 weight percent, with particle sizes having a mean diameter of 30 millimicrons.

Virtually any type of polishing cloth, such as synthetic leather, resin non-woven types, can be used with such a silicon dioxide polishing composition, typical of which are Corofam and Blue Rodell. Polishing may be effected in machines such as described in Goetz et al. U.S. Pat. No. 3,691,694 including modifications thereof in accordance with the planetary configuration of Goetz et al. shown in the IBM Technical Disclosure Bulletin (e.g., TDB), pp. 1760–61, Vol. 15, No. 6, November 1972.

During polishing, wheel speeds may vary from 40 to 200 rpm applied at pressures of 2–6 psi. The slurry feed (e.g., SiO$_2$ polishing composition) is usually continuous at a flow rate of not less than 10 cc per minute and the slurry may be recirculated. The rate of stock removal, from the silicon wafers, is approximately 0.75 mils per hour.

Although the foregoing produces polished wafers having a high and acceptable degree of perfection, the process is nevertheless relatively slow with considerable time required to attain such a degree of perfection. Attempts to accelerate such polishing, as by increasing pressures or nature of abrasives (e.g., size and/or hardness) can result in sub-surface damage which becomes evident in subsequent device fabrication.

Other process and polishing compositions may also be found in U.S. Pat. Nos. 2,744,001. 3,029,160, 3,071,455, 3,170,273, 3,328,141, 3,385,682, 3,429,080, 3,738,881, 3,841,031 and 3,485,608.

SUMMARY OF THE INVENTION

It is an object of this invention to provide a novel reagent composition for polishing silicon semiconductor substrates to a high degree of perfection.

It is another object of this invention to provide a novel reagent composition for chemical/mechanical polishing silicon wafers at enhanced polishing rates to high degree of perfection.

These and other objects are accomplished in accordance with the broad aspects of this invention by use of a novel polishing composition comprised of an aqueous dispersion of colloidal sized polishing abrasive particles (e.g., 5 to 200 millimicrons) admixed with an alkali metal base, preferably the carbonates, and an oxidizing agent selected from the group consisting of sodium and potassium salts of halo derivatives of isocyanuric acid, alternatively known as the corresponding salts of halo-trizenetriones, preferably the corresponding salts of dihaloisocyanuric acid.

Typical abrasives are cerium oxide, aluminum oxide, zirconium oxide, and the like, among which the preferred abrasive is silica (e.g., silicon dioxide).

Preferably, the silicon substrates or wafers are polished with the compositions of this invention by the free-polishing technique such as illustrated in the aforesaid Goetz et al. patent and TDB publication. By this technique, the wafers are placed in openings with circular carriers which are placed between two counter rotating polishing pads. In turn, the periphery of the carrier is geared to mesh between teeth of an independently rotating spindle and gear teeth in a circumscribing periphery of the polisher so as to impart planetary motion to the wafer carriers resulting in relative motion of the carrier and wafers between the rotating polishing pads. In operation, the polishing slurry of this invention is fed continuously to the surface of the polishing pads. The completion of the polishing operation is followed by washing and removal of the wafers or substrates from the polishing mechanism.

The foregoing and other objects, features and advantages of this invention will be apparent from the more particular description of the preferred embodiments of the invention as illustrated in the accompanying drawings.

DESCRIPTION OF PREFERRED EMBODIMENTS

Figure 1:
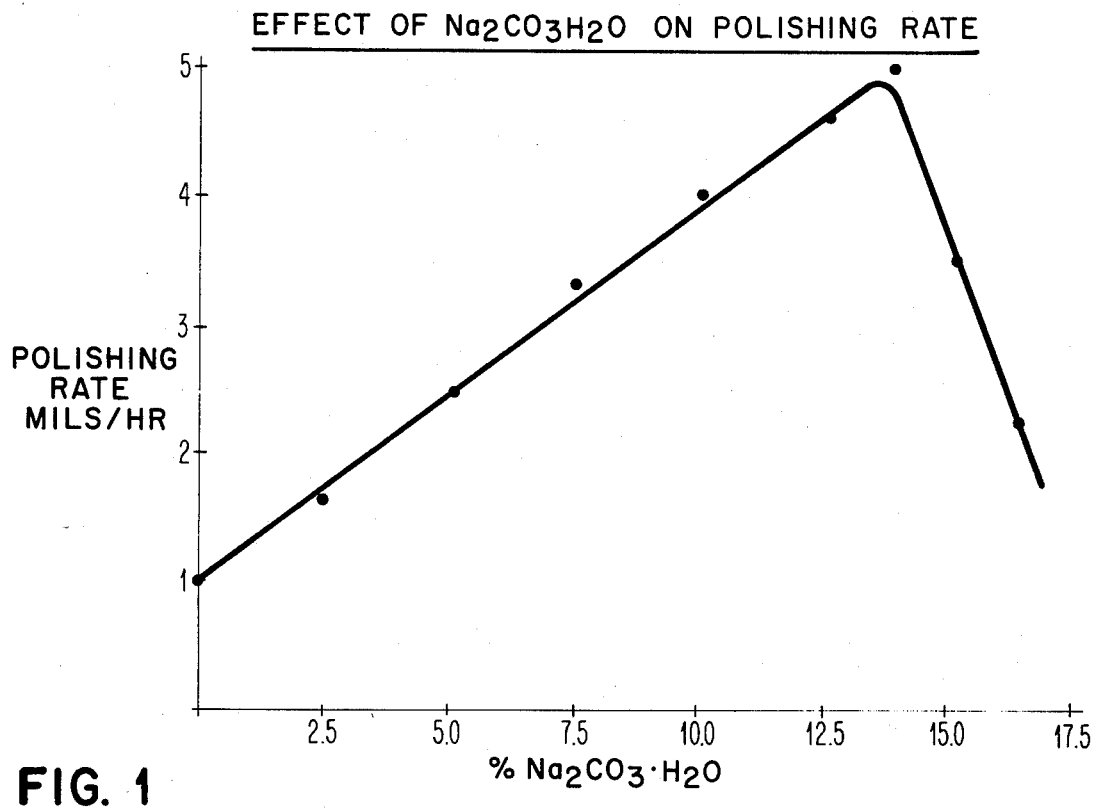
FIG. 1 is a plot of the polishing rate of monocrystalline silicon wafers, or substrates, in mils per hour as a function of the concentration of sodium carbonate in grams per liter, in the polishing compositions of this invention.
Figure 2:
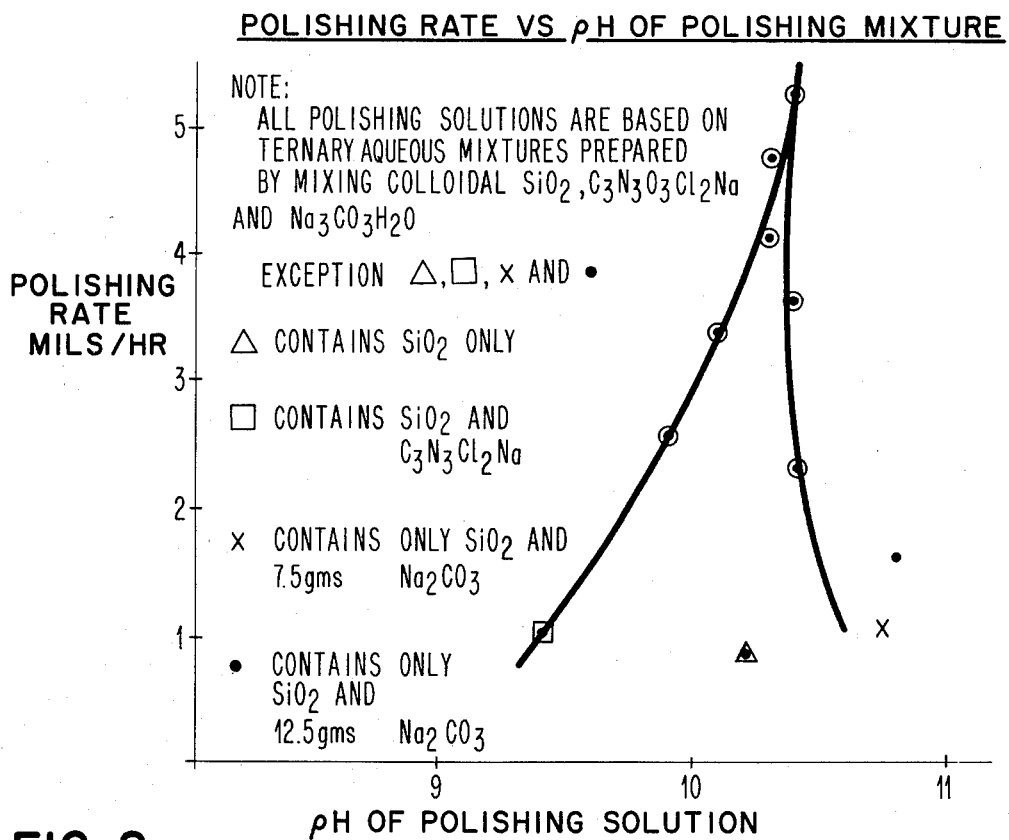
FIG. 2 is a plot of the polishing rante of monocrystalline silicon wafers as a function of the pH of various polishing compositions, including those of this invention.

It is to be understood that although the polishing compositions of this invention have been developed for and are described for the polishing of silicon substrates, such compositions can be advantageously employed for the polishing of other substrates and materials, particularly quartz and the various glasses.

Increased polishing rates of silicon, as high as 5 mils/hour are obtained with the polishing composition of the invention which, in the preferred form, comprise aqueous dispersed silicon dioxide colloidal size particles in admixture of a water soluble alkali metal base, such as sodium hydroxide and preferably sodium carbonate, and either a sodium or potassium salt of dihaloisocyanuric acid, also commonly known as dihalo-i-trizenetrione salts. A typical composition in accordance with this invention will comprise a silica (e.g., $SiO_2$) sol, sodium carbonate and sodium dichloroisocyanurate. With ratios of the carbonate to the dichloroisocyanurate in the range of about 0.5:1 to about 3.2:1, polishing rates for silicon can be obtained of about 2 mils per hour to as high as 5 mils per hour.

The components of the polishing composition can be readily prepared simply by mixing and normally in lots as low as 20 liters for convenience in commercial application. Preferably, the freshly prepared compositions are utilized for polishing, and if previously prepared compositions are to be used, they should be stored in the absence of light which tends to decompose or coagulate the polishing slurry, via the oxidizing agent.

The aqueous dispersion of silicon dioxide can be conveniently employed in the form of silica sols and silica gels having silicon dioxide particle sizes in the range of 1 to 500 millimicrons, in weight percent concentrations of 10 to 50 weight percent. A convenient source of the aqueous dispersion of the silicon dioxide, as employed in all the examples below, is the trademarked silica sol composition "Syton HT-50" commercially available from the Monsanto Company. This Syton HT-50 has a silica content of about 50 weight percent with maximum particle size of 40–45 millimicrons.

Any standard polishing equipment is appropriate for use with the polishing compositions of this invention, as for example that described in the said Goetz et al. U.S. patent. A particularly effective free-polisher is that described in the aforesaid Goetz et al. TDB publication. This free-polisher was employed with rotation of the top plate at 60 rpm, and counter-rotation of the bottom plate at 63 rpm. The top plate pressure on the bottom plate was about 5.2 psi. The polishing cloth employed with the bottom plate was "Blue Rodell" commercially available from Rodell Co. of Wilmington, DE. The polishing cloth employed wih the top plate was commercially available "BRCA" sold by the Process Research Company of Pennington, N.J.

Twelve experiments, each utilizing nine 2¼ inch diameter monocrystalline silicon wafers of <100> crystallographic orientation and a resistivity of 2 ohm cm were polished under identical conditions of the above indicated plate rotation, pressure and slurry flow of 520 ± 10 ml/min. with the exception of the slurry composition. Eight experiments were carried out with the compositions of this invention, whereas four experiments were done by compositions not conforming to the scope of this invention for purposes of comparison of polishing rates. In each of the 12 examples below, bright shiny wafers were obtained, after polishing, with featureless surfaces without any film or surface contamination.

The following table sets forth various examples of solution compositions at a constant slurry flow rate of 520 ± 10 ml/min. at 130 ± 5° F at the above indicated pad rpms and pressure.

| | SOLUTION COMPOSITION | | | | | | |
|---|---|---|---|---|---|---|---|
| | Amount/20l Solution Volume | | | | | Solution pH at | |
| | Silica Sol | $Na_2CO_3 \cdot H_2O$ | Na-Dichloro-Trizene-Tri- | Solution Flow | Polishing Rate | Standing Time | |
| No. | (HT-50) | Grams | Trione grams | Rate mls/min. | mls/hr. | 0 | 2 hr. |
| 1 | 41 | 0 | 0 | 520 ∓ 10 | 0.8 | 10.2 | 10.2 |
| 2 | " | 0 | 100 | " | 1.0 | 9.9 | 9.0 |
| 3 | " | 50 | 100 | " | 1.6 | 9.9 | 9.3 |
| 4 | " | 100 | 100 | " | 2.5 | 9.9 | 9.5 |
| 5 | " | 150 | 100 | " | 3.3 | 10.1 | 9.7 |
| 6 | " | 200 | 100 | " | 4.0 | 10.3 | 9.8 |
| 7 | " | 250 | 100 | " | 4.65 | 10.3 | 9.6 |
| 8 | " | 275 | 100 | " | 5.2 | 10.4 | 9.7 |
| 9 | " | 300 | 100 | " | 3.3 | 10.4 | 9.7 |
| 10 | " | 325 | 100 | " | 2.2 | 10.4 | 9.7 |
| 11 | " | 150 | 0 | " | 1.0 | 10.7 | N.D.* |
| 12 | " | 250 | 0 | " | 1.7 | 1.8 | 10.7 |

*Not Determined

It is evident from the above table that the polishing rate is substantially high when a mixture of colloidal $SiO_2$, $Na_2CO_3$ and Na-dichloroisocyanuric acid (examples 3–10) is used and low if any component is eliminated, e.g., $SiO_2$ – $Na_2CO_3$ (examples 11 and 12) or $SiO_2$ – oxidizing agent (example 2) is used. It is also interesting to note that even though pH of the slurry is high (examples 11–12) when $SiO_2$ - $Na_2CO_3$ mixture is used, the removal rate is considerably low. On the other hand, even though pH is similar (examples 7, 8, 9, 10) at high $Na_2CO_3$ weight levels (examples 9–10), the polishing rates are different. It is thus evident that for the new polishing slurry composition, it is the amount of $Na_2CO_3$ in polishing mixture that is controlling and not pH. It may further be indicated that all mixtures of $Na_2CO_3$-Na-dichloroisocyanuric acid-colloidal $SiO_2$, etc., tend to achieve a pH of less than 10 (about 9.7) after standing for some time without influencing the polishing rates. This further reinforces the point that the variation in polishing rates is due to the amount of base and not pH.

It is believed that the polishing mechanism is due to the rapid oxidation of silicon to $SiO_2$ by the polishing slurry component, followed by softening of $SiO_2$ thus formed to give silica gel (Si $(OH)_4$) which in turn further absorbs the slurry components and becomes softer and is easily removed by the scrubbing action of the polishing slurry. The reaction mechanism is believed to be as follows:

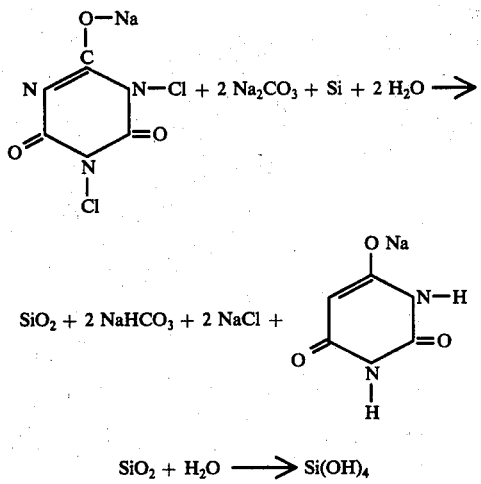

$$SiO_2 + H_2O \longrightarrow Si(OH)_4$$

The lowering of polishing rates at higher sodium carbonate concentrations can be attributed to the formation of considerable amounts of NaClO which in turn coagulate colloidal $SiO_2$ resulting in lower colloidal $SiO_2$ amounts in the slurry and hard suspended particles which can create scratches on the surface.

It may be noted with respect to the polishing compositions of this invention that they tend to stabilize at a pH of about 9.7 on standing for times as long as about two hours. This appears to be due to the reaction of NaOH with the silica particles of the polishing composition, to the extend permitted by the buffering action of $NaHCO_3$ which reduces the pH of the polishing composition to about 9.7. It may be noted that although these pH stabilized compositions are operative in this invention, in practice freshly prepared polishing compositions are normally employed immediately for polishing of silicon wafers.

The foregoing polishing of silicon wafers was repeated (utilizing nine wafers per example) with the exception of the composition changes noted in the table below.

| | SOLUTION COMPOSITION | | | | | | |
| | Amount/20l Solution Volume | | | | | | |
| No. | Silica Sol (HT-50) | NaOH Grams | Na-Dichloro-Trizene-Tri-Trione grams | Solution Flow Rate mls/min. | Polishing Rate mls/hr. | Solution pH at Standing Time | |
| | | | | | | 0 | 2 hr. |
|---|---|---|---|---|---|---|---|
| 13 | 41 | 0 | 100 | 520 ∓ 10 | 1.0 | 9.4 | 9.3 |
| 14 | " | 5 | " | " | 1.0 | 9.5 | N.D.* |
| 15 | " | 15 | " | " | 1.8 | 10.0 | 9.4 |
| 16 | " | 30 | " | " | 2.7 | 10.4 | 10 |
| 17 | " | 40 | " | " | 4.13 | 10.6 | 9.8 |
| 18 | " | 80 | " | " | 3.99 | 11.9 | 11.2 |
| | | | | (after storage, solution shows indication of geling) | | | |
| 19 | " | 120 | " | (slurry starts to coagulate and cannot be used for polishing) | | | |

*Not Determined

As can be seen, the foregoing shows that the pH of the polishing compositions plays no significant role in the polishing phenomena of this invention, whose objectives flow solely from the ternary roles of the abrasive, base and oxidizing components.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A reagent composition for polishing substrates comprising an aqueous mixture of silicon dioxide particles in a size range of about 5 to about 200 millimicrons, a soluble alkali metal base and an oxidizing agent selected from the group consisting of sodium and potassium salts of dihaloisocyanuric acid, wherein the ratio of said base to said oxidizing agent is in the range of about 05:1 to about 3.2:1, and with the ratio of silicon particles to said base in the range of about 8.5:1 to about 55.6:1.

2. The composition of claim 1 wherein said base is an alkali metal carbonate.

3. The composition of claim 2 wherein said carbonate is a sodium salt thereof and said oxidizing agent is selected from the group consisting of potassium and sodium salts of dichloroisocyanuric acid.

4. The composition of claim 3 wherein the ratio of said carbonate to said oxidizing agent is in the range of 0.5:1 to 3.2:1.

5. The composition of claim 1 wherein said particles are selected from the group consisting of silica sols and silica gels.

6. The composition of claim 2 wherein said particles are selected from the group consisting of silica sols and silica gels.

7. The composition of claim 3 wherein said particles are selected from the group consisting of silica sols and silica gels.

8. The composition of claim 4 wherein said particles are selected from the group consisting of silica sols and silica gels.

9. A process for polishing crystalline silicon which comprises applying to a surface of said silicon a polishing composition of claim 1, and polishing said silicon therewith.

10. A process for polishing crystalline silicon which comprises applying to a surface of said silicon a polishing composition of claim 2, and polishing said silicon therewith.

11. A process for polishing crystalline silicon which comprises applying to a surface of said silicon a polishing composition of claim 3, and polishing said silicon therewith.

12. A process for polishing crystalline silicon which comprises applying to a surface of said silicon a polishing composition of claim 4, and polishing said silicon therewith.

13. A process for polishing crystalline silicon which comprises applying to a surface of said silicon a polishing composition of claim 5, and polishing said silicon therewith.

14. A process for polishing crystalline silicon which comprises applying to a surface of said silicon a polishing composition of claim 6, and polishing said silicon therewith.

15. A process for polishing crystalline silicon which comprises applying to a surface of said silicon a polishing composition of claim 7, and polishing said silicon therewith.

16. A process for polishing crystalline silicon which comprises applying to a surface of said silicon a polishing composition of claim 8, and polishing said silicon therewith.

* * * * *